United States Patent [19]

Köhler et al.

[11] Patent Number: 5,064,884

[45] Date of Patent: Nov. 12, 1991

[54] BLENDS OF POLYARYLENE SULFIDES, EPOXIDES, GLASS FIBERS, OPTIONALLY ANHYDRIDE-CONTAINING POLYMERS AND OPTIONALLY OTHER ADDITIVES

[76] Inventors: Burkhard Köhler; Walter Uerdingen; Wolfgang Wehnert; Manfred Schmidt; Walter Schäfer; Klaus Reinking, all of Bayer Aktiengesellschaft, D 5090 Leverkusen, Bayerwerk, Fed. Rep. of Germany

[21] Appl. No.: 664,097

[22] Filed: Mar. 4, 1991

[30] Foreign Application Priority Data

Mar. 16, 1990 [DE] Fed. Rep. of Germany ....... 4008461

[51] Int. Cl.[5] .......................... C08K 5/15; C08K 3/40; C08K 9/06
[52] U.S. Cl. .................................. 524/114; 524/494; 523/214
[58] Field of Search ....................... 524/114, 494, 609; 523/214

[56] References Cited

FOREIGN PATENT DOCUMENTS 0360544 3/1990 European Pat. Off. ............ 524/494

OTHER PUBLICATIONS

Patent Abstracts of Japan, vol. 9, No. 119 (C-282)[1842] (1985).
Patent Abstracts of Japan, vol. 13, No. 275 (C-610)[3623] (1989).
Patent Abstracts of Japan, vol. 12, No. 365 (C532)[3212] (1988).
WPIL, File Supplier, An=88011447, Derwent Publications Ltd., (1987).
WPIL, File Supplier, AN=85009427, Derwent Publications Ltd., (1984).

*Primary Examiner*—Paul R. Michl
*Assistant Examiner*—Peter Szekely

[57] ABSTRACT

The invention relates to blends of polyarylene sulfides, epoxides, glass fibers, optionally anhydride-containing polymers and optionally other additives. They are distinguished by good mechanical properties.

2 Claims, No Drawings

BLENDS OF POLYARYLENE SULFIDES, EPOXIDES, GLASS FIBERS, OPTIONALLY ANHYDRIDE-CONTAINING POLYMERS AND OPTIONALLY OTHER ADDITIVES

This invention relates to blends of polyarylene sulfides, epoxides, glass fibers, optionally anhydride-containing polymers and optionally other additives. The blends according to the invention are distinguished by good mechanical properties.

Polyarylene sulfides (PAS) are known (cf. for example US-A 3,354,129, EP-A 171 021). They are inert, high-temperature-resistant thermoplastics which can be filled to high levels, for example with glass fibers and/or other inorganic fillers. These polymers, particularly polyphenylene sulfide (PPS), are being used to an increasing extent in field hitherto reserved for thermosets.

PAS has unsatisfactory mechanical properties for certain applications in the injection molding field. In particular, outer fiber strain and impact strength are unsatisfactory for practical purposes. Accordingly, it has been found to be an advantage to improve the above-mentioned properties of PAS, for example by blending with other thermoplastics.

Blends of maleic-anhydride-grafted hydrogenated diene rubbers, epoxides and PAS are known (cf. for example JP-A 63-118 369). The large quantities in which the maleic-anhydride-grafted polyolefins of low glass temperature are used may improve toughness, but do not enable flexural strength to be significantly increased.

For certain applications, however, the property spectrum of blends of the type in question is not always entirely satisfactory.

It has now been found that blends of polyarylene sulfide (PAS) with epoxides, glass, fibers, optionally copolymers of maleic anhydride and optionally other additives are distinguished by their mechanical properties.

Accordingly, the present invention relates to blends of

| A) | 89.9 to 29% by weight | polyarylene sulfides, preferably polyphenylene sulfide (PPS), |
|---|---|---|
| B) | 0.1 to 35% by weight 0.2 to 5% by weight | and preferably epoxides corresponding to formula (I) |

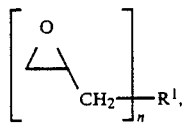

(I)

in which
R[1] is an at least difunctional organic, aliphatic, cycloaliphatic, aromatic, araliphatic or heterocyclic radical preferably containing 2 to 30 C atoms which is attached to the glycidyl unit by an oxygen or nitrogen atom and n is an integer of or greater than 2, preferably 2 or 3,
C) 0.0 to 35% by weight copolymers of maleic anhydride with olefins and/or aromatic vinyl compounds and/or α,β-unsaturated carboxylic acid esters and/or copolymers of anhydrides of α,β-unsaturated carboxylic acid esters and/or aromatic vinyl compounds which preferably have a glass temperature above 30° C., D) 10 to 79.9% by weight and preferably 30 to 60% by weight glass fibers preferably sized with polyurethane film formers and aminosilane or epoxysilane coupling agents, more preferably with aminosilane coupling agents, and E) up to 300% by weight, based on the sum of (A+B+C+D) of other mineral or organic fillers and reinforcing materials and/or inorganic or organic auxiliaries.

Epoxides suitable for use in accordance with the invention are known and, in some cases, are even commercially available (for example Lekutherm®). They may be prepared, for example, in accordance with DE-A 1 770 032, 1 643 777, 2 505 345, US-A 3,963,666, 3,454,421, 3,006,891, 4,582,892, EP-A 143 075 or Angew. Makromol. Chemie 63, 63 (77). They are also known, for example, from Methoden der organischen Chemie (Houben-Weyl), Vol. E 20, Georg Thieme Verlag, Stuttgart/New York, 4th Edition, 1987, pages 1891–1950 and the literature cited therein.

Preferred epoxides corresponding to formula (I) are bisglycidyl bisphenol A, bisglycidyl terephthalate, bisglycidyl tetrahydrophthalate, triglycidyl isocyanurate, triglycidyl urazole, glycidyl ethers of phenol-formaldehyde condensates,N,N-bis-[oxiranylmethyl]-[4-(oxiranylmethoxy)-phenyl]-amine, bis-[4-bis-(oxiranylmethyl)-amino]-phenyl]methane.

The maleic anhydride copolymers according to the invention are preferably produced by radical polymerization. Maleic anhydride copolymers are described, for example, in Maleic Anhydride, page 413, Plenum Press, New York/London, 1982. Some maleic anhydride copolymers are commercially available, for example under the names Lotader® of the CdF Company.

Commercially available glass fibers optionally sized with polyurethane film formers and aminosilane or epoxysilane coupling agents are used in accordance with the invention. They have a diameter of 1 to 20 μm and preferably 5 to 13 μm. It is also possible to use endless glass fibers and/or production processes in which the length of the fibers in the final blend is from 0.05 to 10 mm and preferably from 0.1 to 2 mm. It is also possible to use rovings in processes for the production of roving-reinforced unidirectional composites.

The glass fibers may even be replaced, more particularly in part, by commercially available glass beads, for example Ballotini glass beads.

Other suitable mineral fillers or additives are mica, talcum, silica flour, metal oxides and sulfides such as, for example, $TiO_2$, $ZnO$, $ZnS$, graphite, carbon black, fibers, for example of quartz or carbon, carbonates such as, for example, $MgCO_3$, $CaCO_3$, or sulfate, such as for example $CaSO_4$, $BaSO_4$.

Other standard additives which may be used in accordance with the invention include pigments, mold release agents, E waxes, flow aids, nucleating agents or stabilizers.

The blends according to the invention may be produced in the usual way by extrusion.

The blends according to the invention may be processed in the usual way to moldings, semifinished products, circuit boards, fibers, films, profiles, etc. The blends according to the invention may generally be used with advantage for applications for which thermoplastics are typically used.

EXAMPLES

The blends according to the invention were prepared at 320° C. in Werner & Pfleiderer ZSK 32 twin-screw extruder.

The PPS used had a melt viscosity of 45 Pa.s (306° C.), shear stress=1,000 1/s, and had been produced in accordance with EP-A 171 021.

Chopped strands (CS 7916 ®, a product of Bayer AG) sized with polyurethane film former and aminosilane coupling agents were used as the glass fibers in a quantity of 40% by weight.

The blends were granulated and injection molded to test specimens (for example measuring 80×10×4 mm). The test specimens were tested for flexural strength, outer fiber strain, flexural modulus and impact strength $a_n$ (reversed notched ISO 180).

COMPARISON EXAMPLE

60% PPS was blended with 40% glass fibers.

EXAMPLE 1

58% PPS was blended with 40% glass fibers, 1% triglycidyl isocyanurate and 1% of a copolymer of 15% maleic anhydride, 30% butyl acrylate, 30% methyl methacrylate and 25% styrene.

The mechanical properties are shown in the following Table:

| Example | Flexural strength (MPa) | Outer fiber strain (%) | Flexural modulus (MPa) | Izod notched strength (kJ/m²) |
| --- | --- | --- | --- | --- |
| Comparison | 250 | 1.9 | 13,000 | 30 |
| 3 | 311 | 2.5 | 12,900 | 47 |

We claim:
1. Blends of
   A) 89.9 to 29% by weight polyarylene sulfides,
   B) 0.1 to 35% by weight epoxides corresponding to formula

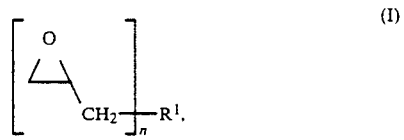

in which
   $R^1$ is an at least divalent $C_{2-30}$ organic radical attached to the glycidyl unit by oxygen or nitrogen atom and
   n is an integer of or greater than 2,
   C) 0.0 to 35% by weight copolymers of maleic anhydride with olefins and/or aromatic vinyl compounds and/or α,β-unsaturated carboxylic acid esters and/or copolymers of anhydrides of α,β-unsaturated carboxylic acids with other olefins and/or α,β-unsaturated carboxylic acid esters and/or aromatic vinyl compounds,
   D) 10 to 79.9% by weight glass fibers and/or other mineral or organic fillers and reinforcing materials and
   E) up to 300% by weight, based on the sum of (A+B+C+D), of inorganic or organic auxiliaries.
2. A molded article prepared from the composition of claim 1.

* * * * *